(12) United States Patent
Xin et al.

(10) Patent No.: US 11,792,974 B2
(45) Date of Patent: Oct. 17, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Xin Xin, Hefei (CN); Jinghao Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/600,239

(22) PCT Filed: Jun. 21, 2021

(86) PCT No.: PCT/CN2021/101338
§ 371 (c)(1),
(2) Date: Mar. 22, 2023

(87) PCT Pub. No.: WO2022/052558
PCT Pub. Date: Mar. 17, 2022

(65) Prior Publication Data
US 2023/0225116 A1 Jul. 13, 2023

(30) Foreign Application Priority Data
Sep. 14, 2020 (CN) .......................... 202010962071.5

(51) Int. Cl.
*H10B 12/00* (2023.01)
*G11C 5/06* (2006.01)

(52) U.S. Cl.
CPC ............. *H10B 12/485* (2023.02); *G11C 5/06* (2013.01); *H10B 12/02* (2023.02); *H10B 12/488* (2023.02)

(58) Field of Classification Search
CPC ........ G11C 5/06; H10B 12/02; H10B 12/485; H10B 12/488; H10B 12/053; H10B 12/315; H10B 12/48; H10B 12/482
See application file for complete search history.

(56) References Cited

U.S. PATENT DOCUMENTS

| 9,837,431 B2 | 12/2017 | Nishikawa et al. | |
| 2006/0249775 A1* | 11/2006 | Park | H10B 12/485 257/E21.507 |
| 2010/0127234 A1 | 5/2010 | Park | |

FOREIGN PATENT DOCUMENTS

| CN | 108140645 A | 6/2018 |
| CN | 111613572 A | 9/2020 |

OTHER PUBLICATIONS

International Search Report and English Translation as cited in PCT/CN2021/101338 dated Sep. 27, 2021, 8 pages.
(Continued)

*Primary Examiner* — Nicholas J Tobergte
*Assistant Examiner* — Kevin Quinto
(74) *Attorney, Agent, or Firm* — Cooper Legal Group, LLC

(57) ABSTRACT

The present disclosure relates to a semiconductor structure and a manufacturing method thereof. The semiconductor structure includes: a substrate including a peripheral region, wherein the peripheral region includes a wire lead-out area, and the substrate is arranged with a plurality of discrete bit line structures; a dielectric layer formed between the adjacent bit line structures, wherein the peripheral region is arranged with a first contact hole; a wire lead-out area with a second through hole; a filling layer filling part of a first contact hole, wherein a remaining part of the first contact hole is defined as a first through hole; a first conductive layer located in the first through hole and the second through hole; and a conductive connecting wire located over the dielectric (Continued)

layer and being in contact with the first conductive layer in the wire lead-out area.

14 Claims, 11 Drawing Sheets

(56) References Cited

OTHER PUBLICATIONS

Written Opinion and English Translation as cited in PCT/CN2021/101338 dated Sep. 27, 2021, 2021, 9 pages.

\* cited by examiner

//SEMICONDUCTOR STRUCTURE AND MANUFACTURING METHOD THEREOF

CROSS-REFERENCE TO RELATED APPLICATIONS

The present disclosure of International Patent Application No. PCT/CN2021/10 national stage is a 1338, filed on Jun. 21, 2021, which claims the priority to Chinese Patent Application No. 202010962071.5, titled "SEMICONDUCTOR STRUCTURE AND MANUFACTURING METHOD THEREOF", filed to China National Intellectual Property Administration on Sep. 14, 2020. The entire contents of 202010962071.5 are No. and Chinese Patent Application 1338 International Patent Application No. PCT/CN2021/10 is incorporated herein by reference.

TECHNICAL FIELD

The present disclosure relates to, but is not limited to, a semiconductor structure and a manufacturing method thereof.

BACKGROUND

The memory is a common semiconductor structure. The memory is a memory component used for storing programs and various kinds of data information, and generally includes a capacitor structure, a bit line and a word line. The capacitor structure is used for storing charges representing stored information, and the bit line or the word line is used for controlling a storage state of the capacitor structure. The bit line or the word line needs to be led out by conductive connecting wires to be connected to a control circuit.

However, in the step of forming the conductive connecting wires, the residual conductive material in the interval of the adjacent conductive connecting wires causes signal interference between the adjacent conductive connecting wires.

SUMMARY

An overview of the subject matter detailed in the present disclosure is provided below, which is not intended to limit the protection scope of the claims.

An aspect of the present disclosure provides a manufacturing method of a semiconductor structure. The manufacturing method of a semiconductor structure includes: providing a substrate; wherein the substrate includes a peripheral region, the peripheral region includes a wire lead-out area, the substrate is arranged with a plurality of discrete bit line structures, a dielectric layer is formed between the adjacent bit line structures, and the peripheral region is arranged with a first contact hole penetrating through the dielectric layer; forming a filling layer; wherein the filling layer fills part of the first contact hole, a top of the filling layer is lower than a top of the dielectric layer, and a remaining part of the first contact hole is defined as a first through hole; etching the wire lead-out area, and forming second through holes; wherein a number of the second through holes is at least two; forming a first conductive layer; wherein the first conductive layer fills the first through hole and the second through holes; removing at least part of the first conductive layer located on a side wall of the first through hole; forming a second conductive layer; wherein the second conductive layer is a continuous film layer, and the second conductive layer is located over the dielectric layer and is also located on a surface of a remaining first conductive layer; and patterning the second conductive layer to form a conductive connecting wire; wherein the conductive connecting wire is electrically connected to the first conductive layer in the wire lead-out area.

Another aspect of the present disclosure provides a semiconductor structure.

The semiconductor structure according to the embodiment of the present disclosure includes: a substrate, including a peripheral region; wherein the peripheral region includes a wire lead-out area, and the substrate is arranged with a plurality of discrete bit line structures; a dielectric layer, formed between the adjacent bit line structures; wherein the peripheral region is arranged with a first contact hole penetrating through the dielectric layer; a wire lead-out area with a second through hole; a filling layer, filling part of a first contact hole; wherein a top of the filling layer is lower than a top of the dielectric layer, and a remaining part of the first contact hole is defined as a first through hole; a first conductive layer, located in the first through hole and the second through hole; wherein a gap is formed between the first conductive layer and a side wall of the first through hole; and a conductive connecting wire, located over the dielectric layer and being in contact with the first conductive layer in the wire lead-out area; wherein the conductive connecting wire is electrically insulated from the first conductive layer located in the first through hole.

BRIEF DESCRIPTION OF THE DRAWINGS

The accompanying drawings incorporated into the description and constituting a part of the description illustrate the embodiments of the present disclosure, and are used together with the description to explain the principles of the embodiments of the present disclosure. Obviously, the drawings in the following description are some embodiments of the present disclosure, but not all embodiments. For those of ordinary skill in the art, other drawings may be obtained based on these drawings without any creative efforts.

DETAILED DESCRIPTION

A semiconductor structure and a manufacturing method thereof provided by the present disclosure are described below with reference to the accompanying drawings and detailed description.

It can be seen from the background art that signal interference exists between adjacent conductive connecting wires in semiconductor structures in the prior art.

Specifically, in the process of manufacturing a semiconductor structure, while a conductive layer filling a first through hole and a second through hole is formed, and is patterned to form conductive connecting wires, the conductive layer on a side wall of the first through hole at the interval of the adjacent conductive connecting wires is not completely etched away, and the adjacent conductive connecting wires are electrically connected by the conductive layer reserved in the first through hole, so that signal interference is generated.

According to the manufacturing method of the semiconductor method provided by the embodiments of the present disclosure, a first conductive layer is formed between a first through hole and a second through hole, and at least part of the first conductive layer located on a side wall of the first through hole is removed, so that when a first through hole is formed at the interval of adjacent conductive connecting wires formed subsequently, a gap is formed between the first conductive layer and the first through hole, therefore, the adjacent conductive connecting wires are not electrically connected by the first conductive layer on the side wall of the first through hole, which is beneficial to reducing signal interference between the adjacent conductive connecting wires.

The embodiments of the present disclosure will be described in detail with reference to the accompanying drawings. However, it will be understood by those skilled in the art that in the embodiments of the present disclosure, numerous technical details are set forth in order to provide the reader with a better understanding of the present disclosure. However, the claimed technical solutions of the present disclosure may also be practiced without these technical details and with various changes and modifications based on the following embodiments.

FIGS. 1-7 are schematic structural diagrams corresponding to steps of a manufacturing method of a semiconductor structure provided by a first embodiment of the present disclosure. The manufacturing method of the semiconductor structure provided by the first embodiment will be described in detail with reference to the accompanying drawings.

Figure 1:
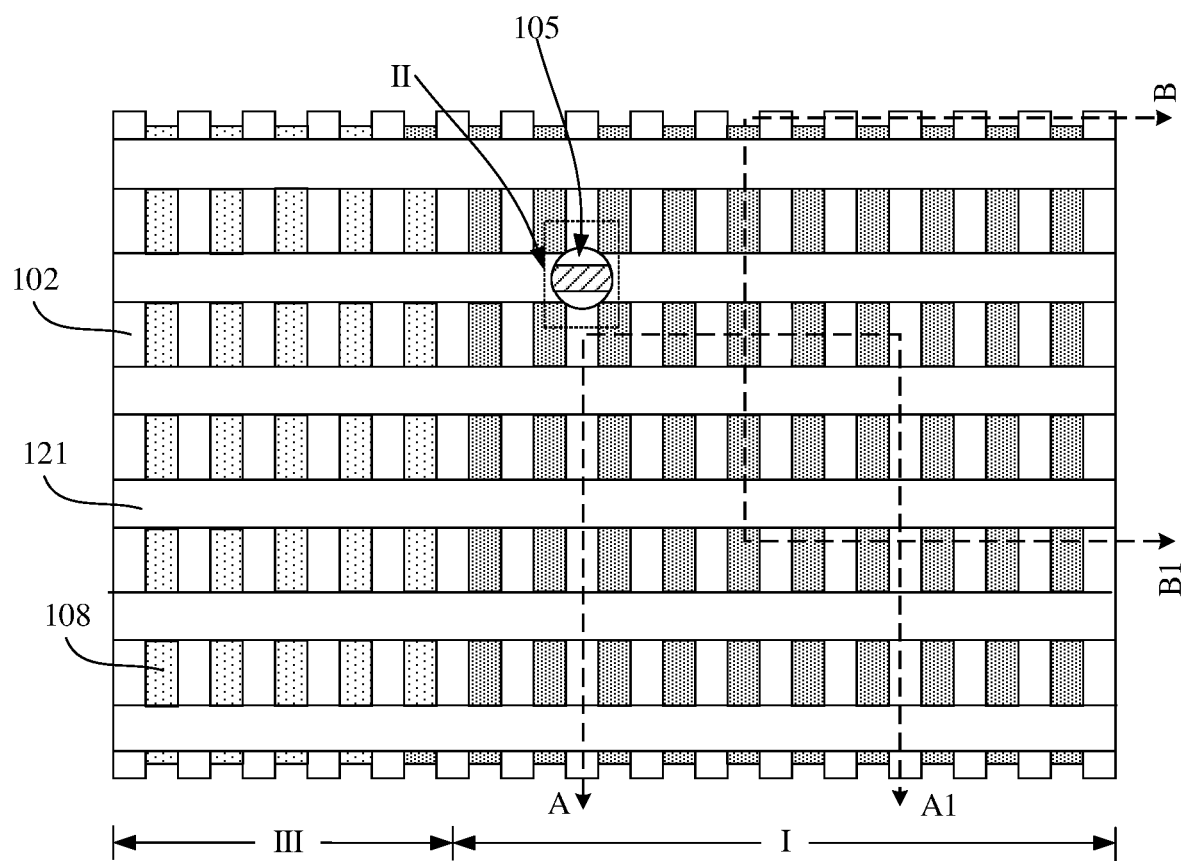
FIG. 1 is a schematic diagram of a top view structure of a semiconductor structure provided by a first embodiment of the present disclosure.
Figure 2:
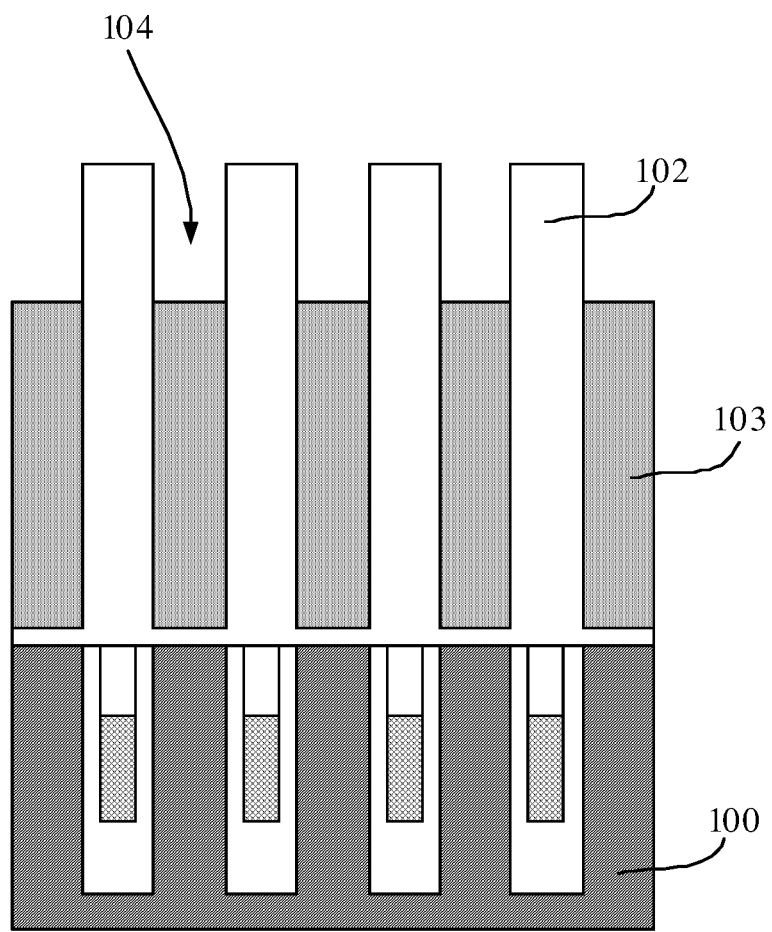
FIG. 2 is a schematic diagram of a partial cross-sectional structure of the semiconductor structure shown in FIG. 1 in an A-A1 direction.
Figure 3:
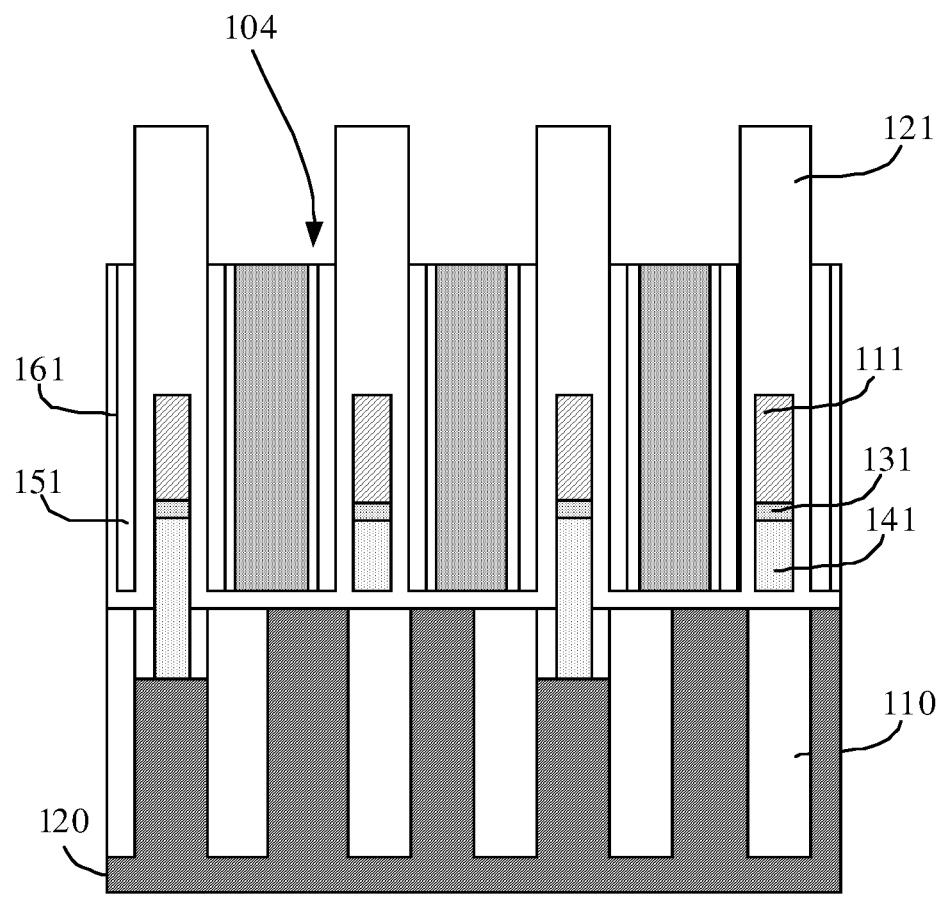
FIG. 3 is a schematic diagram of a partial cross-sectional structure of the semiconductor structure shown in FIG. 1 in a B-B1 direction.

Referring to FIGS. 1-3, FIG. 1 is a schematic diagram of a top view structure, FIG. 2 is a schematic diagram of a partial cross-sectional structure of FIG. 1 in an A-A1 direction, and FIG. 3 is a schematic diagram of a partial cross-sectional structure of FIG. 1 in a B-B1 direction. A substrate 100 is provided. The substrate 100 includes a peripheral region I, and the peripheral region I includes a wire lead-out area II. The substrate 100 is arranged with a plurality of discrete bit line structures. A dielectric layer 102 is formed between the adjacent bit line structures, and the peripheral region I is arranged with a first contact hole penetrating through the dielectric layer 102.

In some embodiments of the present disclosure, the wire lead-out area II is taken as a bit line lead-out area as an example, that is, a conductive connecting wire being electrically connected to a bit line conductive layer in the wire lead-out area II is subsequently formed. In addition, two wire lead-out areas II are shown schematically in FIG. 1, and data on the wire lead-out areas II can be set according to actual conditions.

In some embodiments of the present disclosure, the substrate 100 is a silicon substrate having an isolation structure 110 and an active area 120 therein. The material of the isolation structure 110 is oxide. In other embodiments, the substrate may also be a germanium substrate, a silicon germanium substrate, a silicon carbide substrate, a silicon substrate on an insulator, or the like.

In some embodiments of the present disclosure, the bit line structures include a bit line conductive layer 111 and a covering layer 121 which are sequentially formed and stacked. A bit line diffusion barrier layer 131 and a bit line contact layer 141 are further included between the bit line conductive layer 111 and the substrate 100. In addition, a side wall of a bit line is arranged with a first side wall protection layer 151 and a second side wall protection layer 161 which are stacked and formed at a time, and a top of the first side wall protection layer 151 and a top of the second side wall protection layer 161 are flush, and are both lower than a top of the dielectric layer 102. The material of the bit line conductive layer 111 is tungsten, the material of the covering layer 121 is silicon nitride, the material of the bit line diffusion barrier layer 131 is titanium nitride, the material of the bit line contact layer 141 is polysilicon, and the materials of the first sidewall protection layer and the second side wall protection layer are oxide or nitride. In other embodiments, a single protection layer or three protection layers may be disposed on the side wall of the bit line.

In addition, the material of the dielectric layer 102 may be the same as the material of the covering layer 121, and an included angle between an extending direction of the dielectric layer 102 and an extending direction of the bit line is 60-90 degrees. In other embodiments, the material of the dielectric layer and the material of the covering layer may also be different.

In some embodiments of the present disclosure, the substrate 100 further includes an array region III, provided with a second contact hole penetrating through the dielectric layer 102. The second contact hole is a capacitor contact hole, namely a capacitor contact hole configured to be electrically connected with the active area in the substrate 100, and the capacitor contact hole provides a process basis for electrical connection between a capacitor formed subsequently and the substrate 100. It is understandable that the second contact hole and the first contact hole may be formed in the same process step. With continued reference to FIGS. 1-3, a filling layer 103 is formed. The filling layer 103 fills part of the first contact hole, and a top of the filling layer 103 is lower than the top of the dielectric layer 102. The remaining part of the first contact hole is define as a first through hole 104.

In some embodiments of the present disclosure, a height of the first through hole 104 is 50-150 nm in a direction perpendicular to a surface of the substrate 100, and further may be 90-110 nm.

In some embodiments of the present disclosure, the material of the filling layer 103 is an insulating material including an oxide. Therefore, the first contact hole is a pseudo capacitor contact hole, so that the first conductive layer formed subsequently in the first through hole 104 is electrically isolated from the active area at a bottom of the first contact hole.

In other embodiments, the material of the filling layer may also be a conductive material.

In some embodiments of the present disclosure, the step of forming a third conductive layer 108 is further included. The third conductive layer 108 fills part of the second contact hole, a top of the third conductive layer 108 is lower than the top of the dielectric layer 102, and the remaining part of the second contact hole is define as a third through hole. The third conductive layer 108 is a capacitor contact structure. With continued reference to FIG. 1, the wire lead-out area II is etched to form second through holes 105, the number of the second through holes is at least two. One through hole 105 is correspondingly formed in each wire lead-out area II. The step of etching the wire lead-out area II in some embodiments of the present disclosure includes: etching the covering layer 121 of the wire lead-out area II to expose the bit line conductive layer 111 of the wire lead-out area II to form second through holes 105, the number of the second through holes is at least two.

In some embodiments of the present disclosure, the bit line conductive layer 111 is electrically connected to a control circuit by subsequently filling the second through holes 105 with a conductive material, and a storage state of the capacitor structure is controlled by the bit line. The second through holes 105 are distributed at intervals, and the adjacent second through holes 105 are isolated by the dielectric layer 102 and the covering layer 121.

Figure 4:
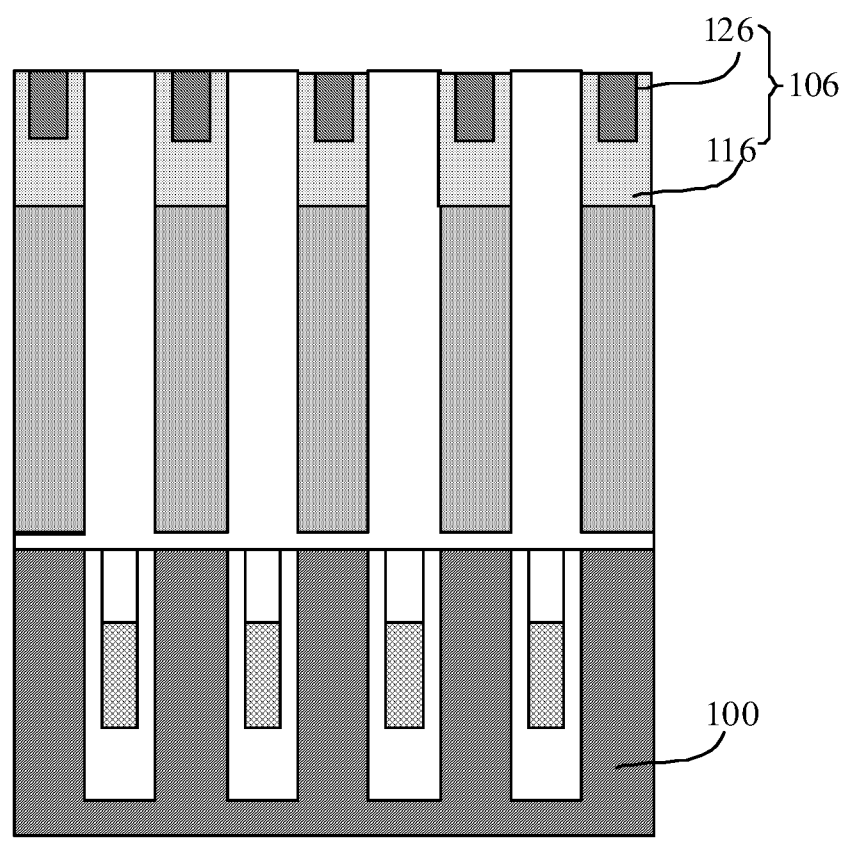
FIG. 4 is a schematic diagram of a partial cross-sectional structure of the semiconductor structure shown in FIG. 1 after forming a first conductive layer in an A-A1 direction.

Referring to FIG. 4, a first conductive layer 106 is formed. The first conductive layer 106 fills the first through hole 104 (referring to FIG. 2) and the second through holes 105 (referring to FIG. 3).

In some embodiments of the present disclosure, the step of forming the first conductive layer 106 includes: a diffusion barrier layer 116 and a metal layer 126 are sequentially formed and stacked in the first through hole 104 and the second through holes 105, the diffusion barrier layer 116 is at least located on a side wall of the first through hole 104, and the metal layer 126 fills the first through hole 104 and the second through holes 105.

In some embodiments of the present disclosure, the step of forming the first conductive layer 106 includes: a conductive film filling the first through hole 104 and the second through holes 105 is formed, and the conductive film is also located over the dielectric layer 102 and the covering layer 121; and the conductive film is flattened to remove the conductive film higher than the top of the dielectric layer 102 and a top of the covering layer 121 to form the first conductive layer 106.

In some embodiments of the present disclosure, because a top of the diffusion barrier layer 116, a top of the metal layer 126, the top of the covering layer 121 and the top of the dielectric layer 102 are flush, only the diffusion barrier layer 116 can be etched without a mask when at least the part of the diffusion barrier layer 116 located on the side wall of the first through hole 104 is subsequently removed. The problem of etching position deviation caused by alignment precision is avoided, and it is ensured that the diffusion barrier layer 116 on the side wall of the first through hole 104 can be completely etched. Because the etching process has etch selectivity for the diffusion barrier layer 116, the metal layer 126, the covering layer 121, and the dielectric layer 102, a maskless etching process can be used to etch only the diffusion barrier layer 116 on the side wall of the first through hole 104.

In other embodiments, the step of forming the first conductive layer may further includes: before the diffusion barrier layer and the metal layer are formed, an electric contact layer is also formed. The electric contact layer is located at a bottom of the first through hole and bottoms of the second through holes. The material of the electrical contact layer is the same as the material of the diffusion barrier layer.

In some embodiments of the present disclosure, the diffusion barrier layer 116 is further located at the bottom of the first through hole 104. On one hand, the diffusion barrier layer 116 functions as an adhesion layer, and the deposition quality of the metal layer 126 can be better by disposing the diffusion barrier layer 116 between the metal layer 126 and the filling layer 103. On the other hand, the diffusion barrier layer 116 advantageously avoids ion diffusion between the metal layer 126 and the filling layer 103.

In addition, a thickness of the diffusion barrier layer 116 is 5-15 nm, and the thickness of the diffusion barrier layer 116 is less than a thickness of the metal layer 126. It should to be noted that the thickness of the diffusion barrier layer 116 refers to the thickness parallel to a direction of a surface of the substrate 100.

In some embodiments of the present disclosure, the thickness of the diffusion barrier layer 116 is 5-15 nm, and a width of a corresponding gap formed by subsequently removing the diffusion barrier layer 116 is 5-15 nm. The width of the gap is small, which is favorable for further ensuring that conductive connecting wires formed subsequently do not fall into the gap, and further avoiding electrical connection between the wire connecting lines and the diffusion barrier layer 116 remaining on the side wall of the first through hole 104. Therefore, the problem of signal interference between the conductive connecting wires is further relieved.

Because the diffusion barrier layer 116 on the side wall of the first through hole 104 is subsequently removed, a gap is formed between the metal layer 126 and the first through hole 104. When the second conductive layer is formed on the top of the dielectric layer 102, the second conductive layer is a continuous film layer. When the second conductive layer is deposited at the gap, due to the influence of gravity of the second conductive layer, part of the second conductive layer falls into the gap. When the thickness of the diffusion barrier layer 116 is greater, the second conductive layer may drop into the gap more deeply, and the conductive connecting wires formed subsequently are more easily electrically connected to the remaining diffusion barrier layer 116 on the side wall of the first through hole 104, so that the thickness of the diffusion barrier layer 116 is not preferably too large. In some embodiments of the present disclosure, a thickness range of the diffusion barrier layer 116 may 8-12 nm.

In some embodiments of the present disclosure, in the step of forming the first conductive layer, the first conductive layer also fills the third through hole.

In some embodiments of the present disclosure, the first conductive layers of the peripheral region I, the wire lead-out area II and the array region III are formed by the same process flow, so that the process flow of manufacturing the semiconductor structure is simplified.

Figure 5:
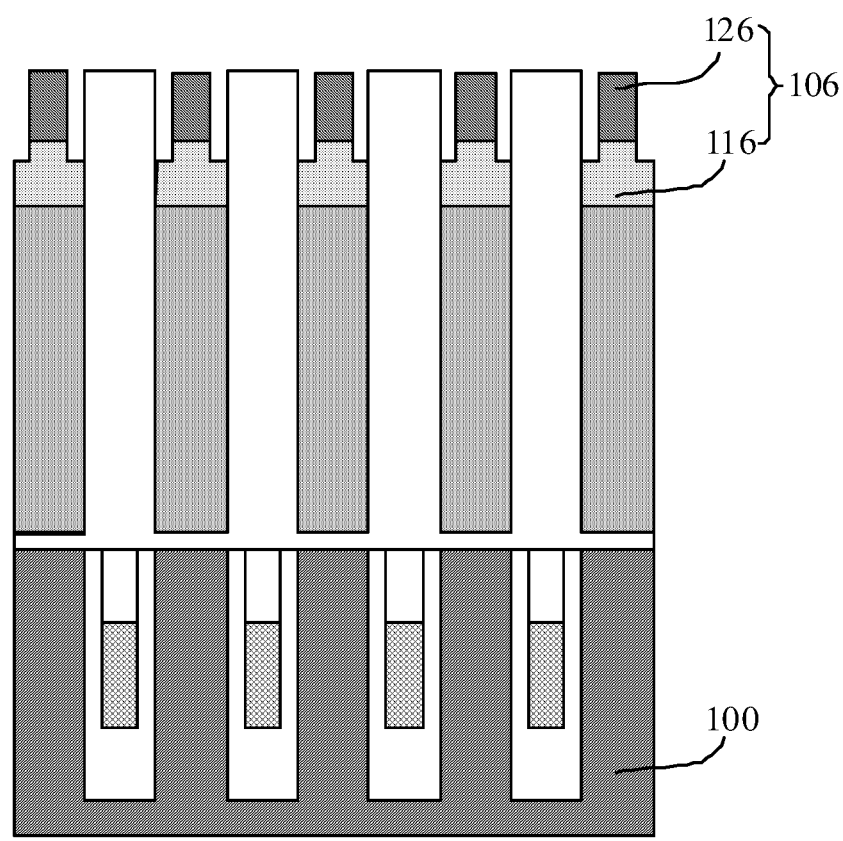
FIG. 5 is a schematic diagram of a cross-sectional structure of the semiconductor structure shown in FIG. 1 after removing at least part of a first conductive layer located on a side wall of a first through hole.

Referring to FIG. 5, at least part of the first conductive layer 106 on the side wall of the first through hole 104 is removed.

In some embodiments of the present disclosure, the part of the first conductive layer 106 located on the side wall of the first through hole 104 is removed. It is believed that the first through hole includes a bottom area and a top area in communication, the bottom area is close to the substrate 100, the first conductive layer located in the top area is removed, and the first conductive layer located in the bottom area remains.

In some embodiments of the present disclosure, the at least part of the diffusion barrier layer 116 located on the side wall of the first through hole 104 is removed, that is, the diffusion barrier layer 116 in the top area is removed. Because the materials of the diffusion barrier layer 116, the metal layer 126 and the dielectric layer 102 are all different, that is, the same etching process has high etching selectivity to the diffusion barrier layer 116, the metal layer 126 and the dielectric layer 102. Therefore, the diffusion barrier layer 116 located on the side wall of the first through hole 104 can be removed without forming a mask, the process steps are reduced, the process cost is saved, and the etching error problem caused by alignment precision can be avoided.

In addition, in a direction perpendicular to the surface of the substrate 100, the length of the first conductive layer 106 removed is greater than or equal to 50 nm so as to further ensure that adjacent conductive connecting wires formed subsequently are not electrically connected by the diffusion barrier layer 116 on the side wall of the first through hole 104, thereby facilitating reduction of signal interference between the adjacent conductive connecting wires.

In other embodiments, all of the diffusion barrier layer on the side wall of the first through hole may also be removed.

In some embodiments of the present disclosure, before the at least part of the first conductive layer 106 located on the side wall of the first through hole 104 is removed, a first mask layer is formed, and the first mask layer covers the wire lead-out area II. Because the first conductive layer 106 is also formed in the second through holes 105 of the wire lead-out region II, when the second through holes 105 is covered by the first mask layer, the first conductive layer 106 in the second through holes 105 will not be removed, the electrical connection area of the first conductive layer 106 and the bit line conductive layer 111 is larger, and it is ensured the first conductive layer 106 of the second through hole and the bit line conductive layer 111 have smaller contact resistance. Therefore, the conductive effect between the conductive connecting wires subsequently formed on the first conductive layer 106 and the bit line conductive layer 111 is better.

In some embodiments of the present disclosure, before the at least part of the first conductive layer 106 located on the side wall of the first through hole 104 is removed, a second mask layer is formed, and the second mask layer covers the first conductive layer 106 in the array region III. Because the first conductive layer 106 is also formed in the third through hole, when the third through hole is covered by the second mask layer, the first conductive layer 106 in the third through hole will not be removed, and the electrical connection area of the first conductive layer 106 and the active area at a bottom of the third through hole is larger. Therefore, the conductive effect between the landing pad subsequently formed on the first conductive layer 106 and the active area is better.

In addition, the first mask layer and the second mask layer may be a same mask layer, so that in the step of removing the at least part of the first conductive layer 106 located on the side wall of the first through hole 104, the first conductive layer 106 located below the first mask layer and the second mask layer can be kept at the same time, the number of the mask layers is reduced, and the cost for manufacturing the semiconductor structure is reduced.

In some embodiments of the present disclosure, the etching process for removing the diffusion barrier layer 116 may be plasma etching. Etching gas uses sulfur hexafluoride. In other embodiments, the etching process may also use wet etching.

Figure 6:
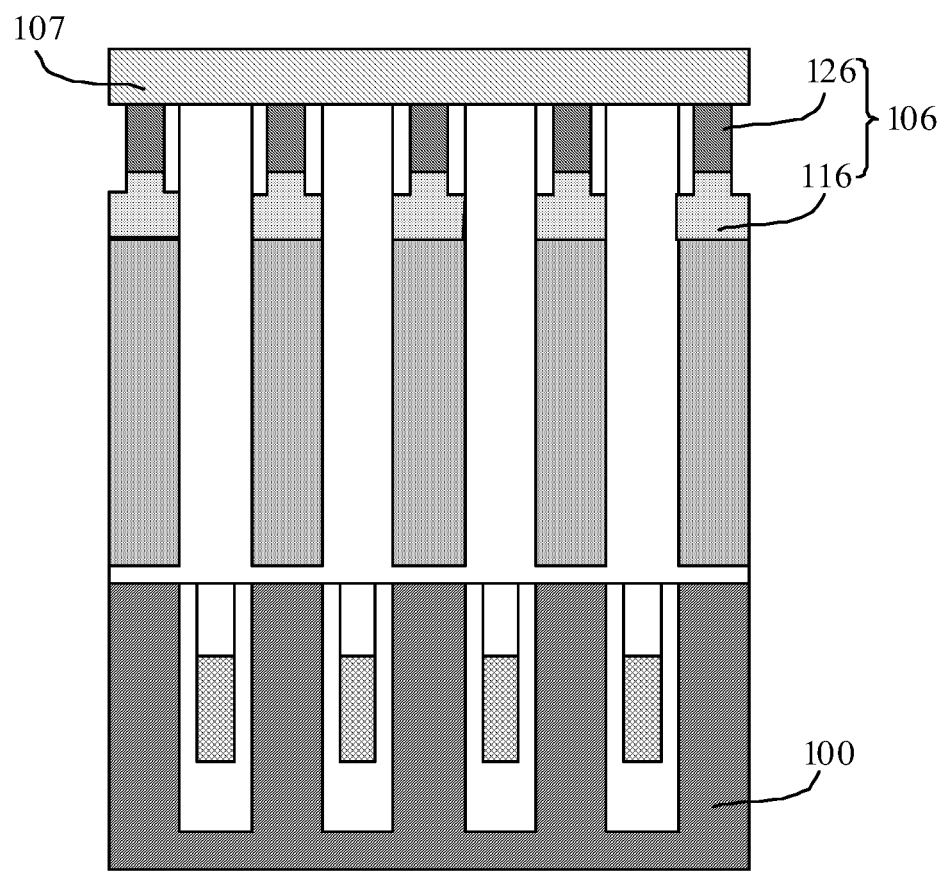
FIG. 6 is a schematic diagram of a partial cross-sectional structure of the semiconductor structure shown in FIG. 1 after forming a first conductive layer in in an A-A1 direction.

Referring to FIG. 6, the second conductive layer 107 is formed. The second conductive layer 107 is a continuous film layer, and the second conductive layer 107 is located over the dielectric layer 102 and the covering layer 121, and is also located on the surface of the remaining first conductive layer 106.

The second conductive layer 107 is configured to subsequently form the conductive connecting wires.

In some embodiments of the present disclosure, in the step of forming the second conductive layer 107, the second conductive layer 107 is also located in the array region III. The second conductive layer 107 located in the array region III is used to provide a process basis for forming a landing pad (LP).

In some embodiments of the present disclosure, the same process flow is used to form the second conductive layer 107 in the peripheral region I, the wire lead-out area II and the array region III, and the process flow of manufacturing the semiconductor structure is further simplified.

Figure 7:
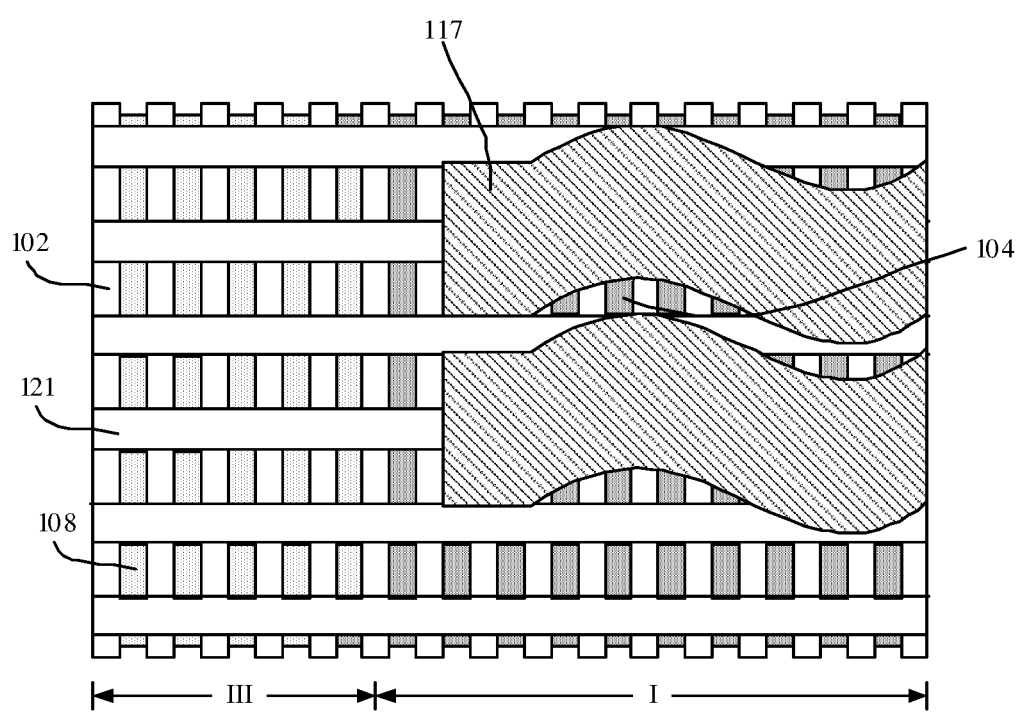
FIG. 7 is a schematic diagram of a top view structure of the semiconductor structure shown in FIG. 1 after patterning the second conductive layer.
Figure 8:
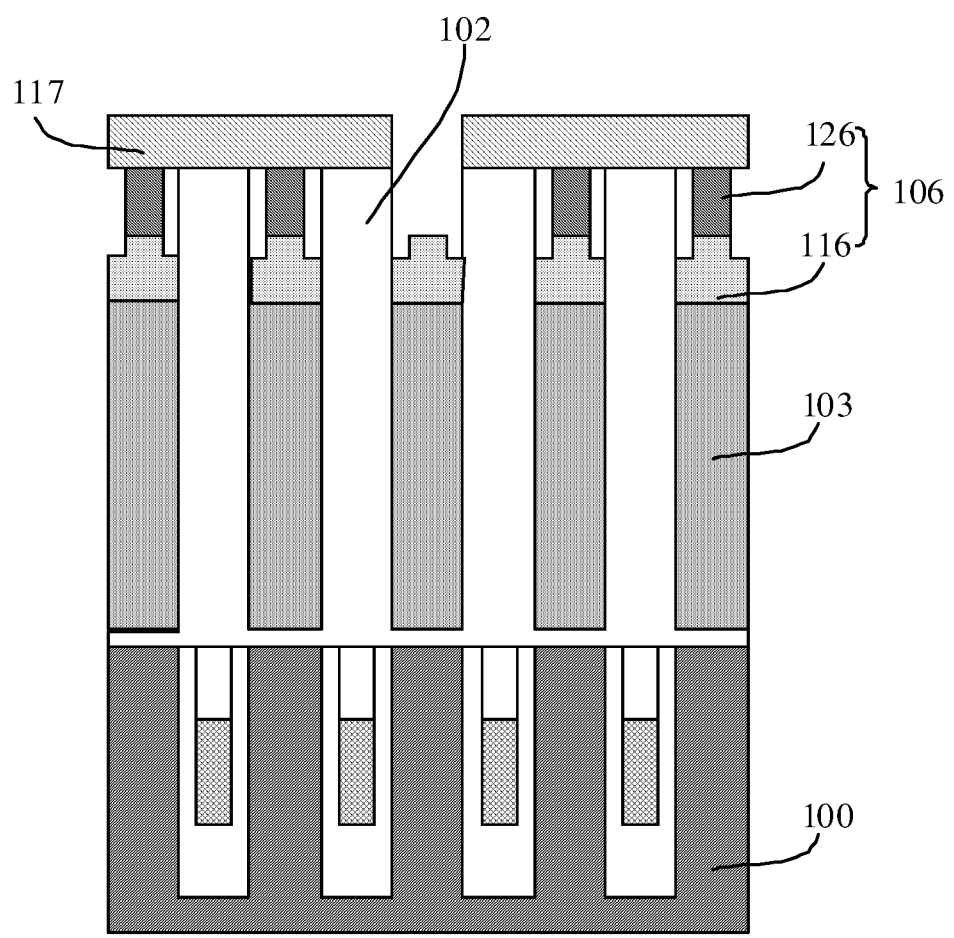
FIG. 8 is a schematic diagram of a partial cross-sectional structure of the semiconductor structure shown in FIG. 7.

Referring to FIG. 7 and FIG. 8, FIG. 7 is a schematic diagram of a top view structure, and FIG. 8 is a schematic diagram of a cross-sectional structure. The second conductive layer 107 is patterned to form the conductive connecting wires 117, the conductive connecting wire is electrically connected to the first conductive layer 106 in the wire lead-out area II.

In some embodiments of the present disclosure, the conductive connecting wires 117 formed by patterning the second conductive layer 107 are wavy, that is, opposite side walls of the adjacent conductive connecting wires 117 are wavy in appearance.

The first through hole 104 will exist at the interval of the adjacent conductive connecting wires 117, and partial areas of the adjacent conductive connecting wires 117 are located above the first through hole 104. Because the at least part of the diffusion barrier layer 116 on the side wall of the first through hole 104 is removed for forming the first conductive layer 106, which is beneficial to preventing the adjacent conductive connecting wires 117 from being electrically connected by the diffusion barrier layer 116 on the side wall of the first through hole 104, and reducing signal interference between the adjacent conductive connecting wires 117.

In some embodiments of the present disclosure, the step of patterning the second conductive layer 107 to form the conductive connecting wires 117 includes: the second conductive layer 107 above the first through hole 104 at the interval between the adjacent conductive connection lines 117 is removed, and the metal layer 126 in the first through hole 104 further is removed. It is further ensured that the adjacent conductive connection lines 117 are not electrically connect by the diffusion barrier layer 116 on the side wall of the first through hole 104 and the metal layer 126.

In other embodiments, it is also possible to only remove the second conductive layer 107 above the first through hole 104 at the interval of the adjacent conductive connecting wires 117.

In addition, in the step of patterning the second conductive layer 107, the second conductive layer 107 located in the array region III is also patterned to form a plurality of discrete landing pads. Each of the landing pads is electrically connected to the first conductive layer 106 located in the third through hole, so as to subsequently form a plurality of discrete capacitor posts on the landing pads for storing charges representing stored information.

In some embodiments of the present disclosure, when the second conductive layer 107 is patterned, the conductive connecting wires 117 located in the peripheral region I and the landing pad located in the array region III are integrally formed. The process flow of manufacturing the semiconductor structure is further simplified.

Figure 9:
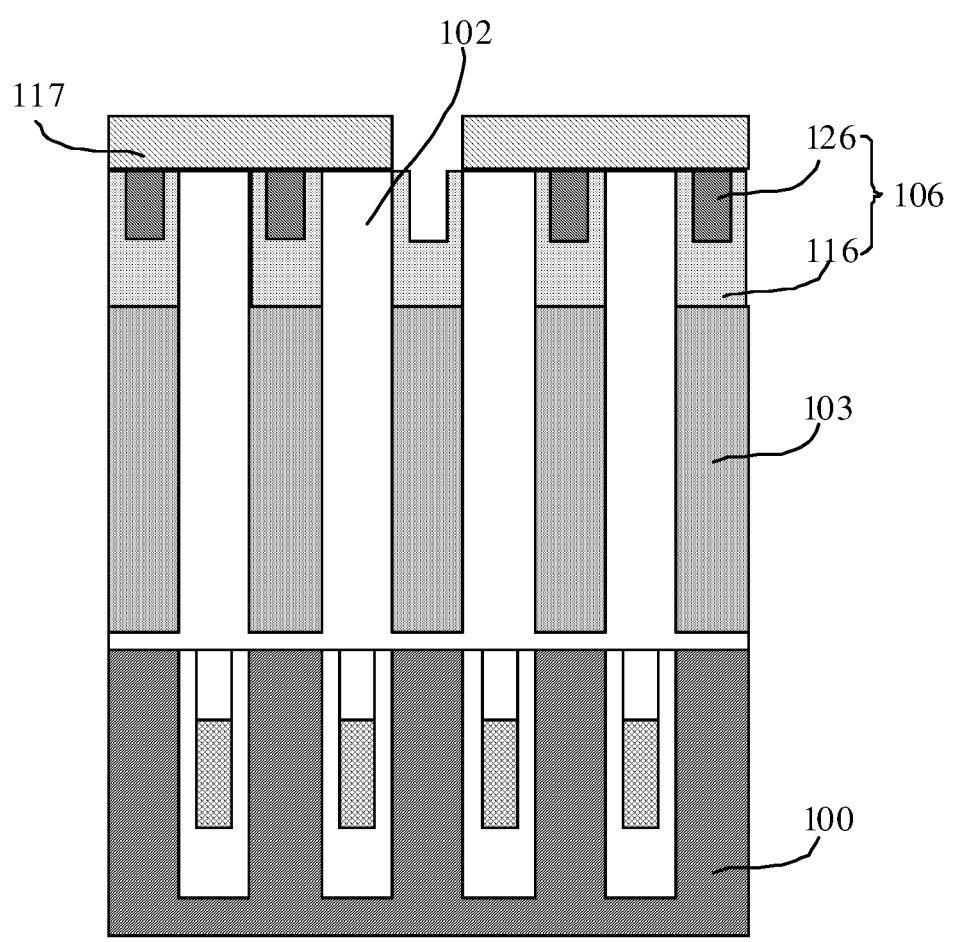
FIG. 9 is a schematic structural diagram of the semiconductor structure provided by a first embodiment of the present disclosure in which a first conductive layer on a side wall of a first through hole is not removed.

In summary, in the manufacturing method of the semiconductor structure provided by this embodiment, when the first conductive layer 106 is formed in the first through hole 104 and the second through holes 105, and the at least part of the first conductive layer 106 located on the side wall of the first through hole 104 is removed, because the first through hole 104 is formed at the interval of the adjacent conductive connecting wires 117 which are subsequently formed, and the gap is formed between the first conductive layer 106 and the side wall of the first through hole 104, the situation that the adjacent conductive connecting wires 117 are electrically connected by the first conductive layer 106 on the side wall of the first through hole 104 as shown in FIG. 9 is avoided, which is beneficial to reducing signal interference between the adjacent conductive connecting wires 117.

In addition, the first conductive layer 106 and the second conductive layer 107 are formed in the peripheral region I and the array region II at the same time, and meanwhile the second conductive layer 107 is patterned, so that the conductive connecting wires 117 are formed in the peripheral region, and the landing pad is formed in the array region III. The process flow of manufacturing the semiconductor structure is simplified.

The second embodiment of the present disclosure further provides a manufacturing method of a semiconductor structure. This embodiment is substantially the same as the previous embodiment, and main differences include that the positions of wire lead-out areas are different and process steps of etching the wire lead-out areas are different. Hereinafter, the manufacturing method of the semiconductor structure provided by the second embodiment of the present disclosure will be described in detail with reference to the accompanying drawings. It should be noted that the same or corresponding parts as those of the foregoing embodiment may refer to the detailed description of the foregoing embodiment, which will not be described in detail herein.

Figure 10:
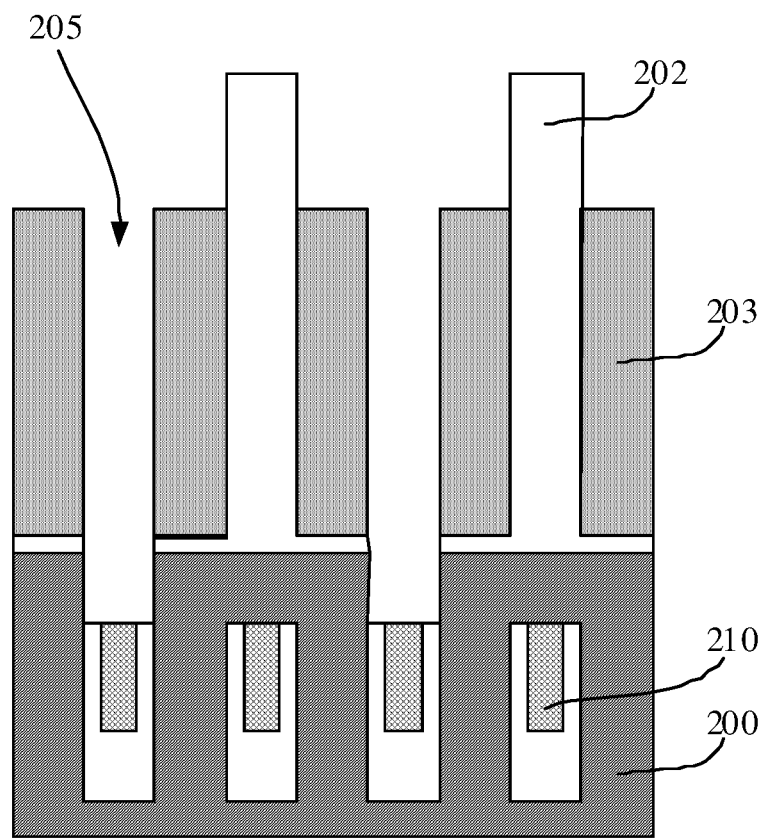
FIG. 10 is a schematic diagram of a cross-sectional structure of a semiconductor structure perpendicular to a word line direction according to a second embodiment of the present disclosure.
Figure 11:
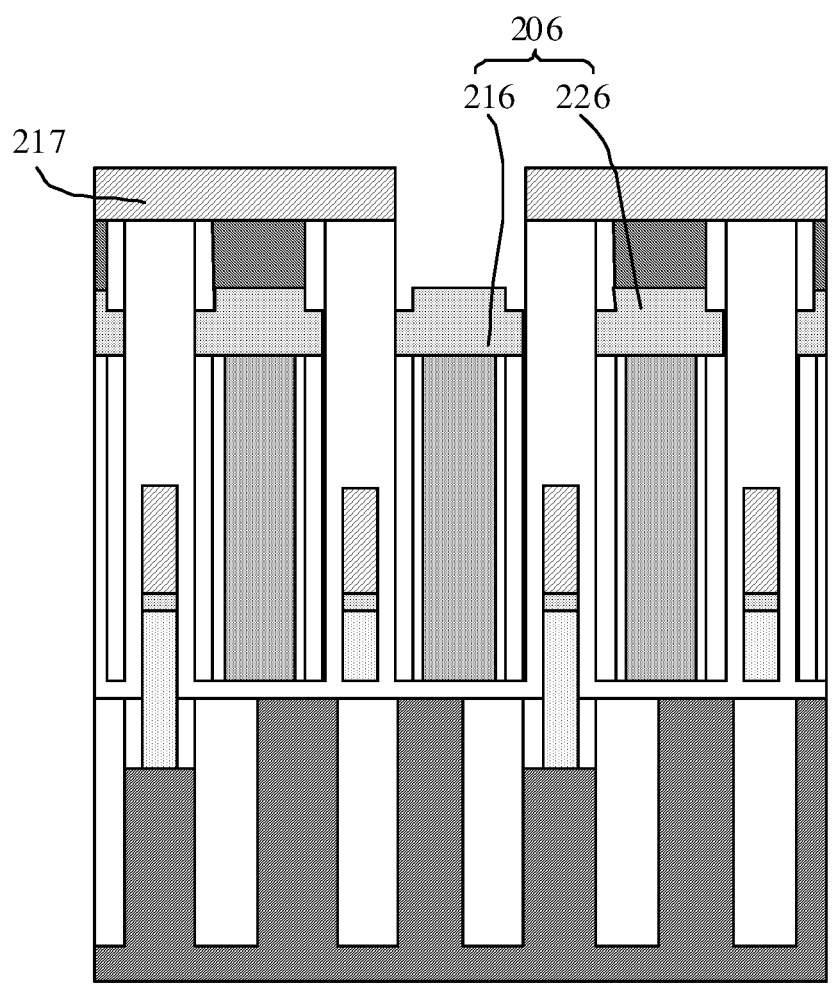
FIG. 11 is a schematic diagram of a cross-sectional structure of a first through hole perpendicular to a bit line direction according to a second embodiment of the present disclosure.

Referring to FIG. 10 and FIG. 11, FIG. 10 is a schematic diagram of a cross-sectional structure of a semiconductor structure perpendicular to a word line direction according to the second embodiment of the present disclosure, and FIG. 11 is a schematic diagram of a cross-sectional structure of a first through hole perpendicular to a bit line direction according to a second embodiment of the present disclosure. A substrate 200 is provided. The substrate 200 includes a peripheral region, and the peripheral region includes a wire lead-out area. The substrate 200 is arranged with a plurality of discrete bit line structures. A dielectric layer 202 is formed between the adjacent bit line structures, and the peripheral region is arranged with a first contact hole penetrating through the dielectric layer 202.

In some embodiments of the present disclosure, the wire lead-out area is taken as a word line lead-out area as an example, that is, a conductive connecting wire electrically connected to a word line of the wire lead-out area is subsequently formed.

A filling layer 203 is formed. The filling layer 203 fills part of the first contact hole, and a top of the filling layer 203 is lower than a top of the dielectric layer 202. The remaining part of the first contact hole is define as a first through hole. The wire lead-out area is etched to form second through holes 205, the number of the second through holes is at least two.

In some embodiments of the present disclosure, the step of etching the wire lead-out area includes: etching the wire lead-out area until the word line 210 are exposed, and forming the second through holes 205, wherein a number of the second through holes is at least two.

The subsequent process step includes: forming a first conductive layer 206, where the first conductive layer 206 fills the first through hole and the second through holes 205; removing at least at part of first conductive layer 206 located on a side wall of the first through hole; forming a second conductive layer, where the second conductive layer is a continuous film layer, is located over the dielectric layer 202 and a covering layer, and is also located on a surface of the remaining first conductive layer 206; and patterning the second conductive layer to form a conductive connecting wire 217, the conductive connecting wire is electrically connected to the first conductive layer 206 in the wire lead-out area.

In some embodiments of the present disclosure, the conductive connecting wire 217 is electrically connected to the word line 210.

The same or corresponding parts in specific process steps of forming the first conductive layer 206, the second conductive layer and the conductive connecting wire 217 as those of the foregoing embodiment may refer to the detailed description of the foregoing embodiment, which will not be described in detail herein.

In the manufacturing method of the semiconductor structure provided by this embodiment, in the step of forming the conductive connecting wire 217 connected to the word line 210, the first conductive layer 206 located on the side wall of the first through hole is removed, so that unnecessary electrical connection occurring between the adjacent electric connecting lines 217 by the first conductive layer 206 in the first through hole is prevented, the signal interference problem of adjacent word line 210 is avoided, and the electrical performance of the formed semiconductor structure is improved.

Correspondingly, the embodiment of the present disclosure further provides a semiconductor structure which may be manufactured by the manufacturing method of the semiconductor structure provided by the above embodiment.

Referring to FIG. 8, the semiconductor structure includes: a substrate 100 including a peripheral region I, where the peripheral region includes a wire lead-out area, and the substrate 100 is arranged with a plurality of discrete bit line structures; a dielectric layer 102 formed between the adjacent bit line structures, where the peripheral region is arranged with a first contact hole penetrating through the dielectric layer; a wire lead-out area with a second through hole; a filling layer 103 is formed in the first contact hole, where a top of the filling layer 103 is lower than a top of the dielectric layer 102, and the remaining part of the first contact hole is define as a first through hole; a first conductive layer 106, located in the first through hole and the second through hole, where a gap is formed between the first conductive layer 106 and a side wall of the first through hole; and a conductive connecting wire 117, located over the dielectric layer 102 and a covering layer 121 and being in contact with the first conductive layer 106 in the wire lead-out area, where the conductive connecting wire is electrically insulated from the first conductive layer 106 located in the first through hole.

In some embodiments of the present disclosure, each of the bit line structures includes a bit line conductive layer 111 located on the substrate 100 and the covering layer 121, the covering layer located on one side of the bit line conductive layer 111 away from the substrate 100. The wire lead-out area is a bit line lead-out area. Correspondingly, the second through hole exposes the bit line conductive layer 111 so as to realize electrical connection between the conductive connecting wire 117 and the bit line conductive layer 111.

In other embodiments, the wire lead-out area may also be a word line lead-out area. Correspondingly, the second through hole exposes a word line so as to realize electrical connection between the conductive connecting wire and the word line.

The first conductive layer 106 includes a diffusion barrier layer 116, at least located at a bottom of the first through hole and a bottom of the second through hole; and a metal layer 126, at least located on the diffusion barrier layer 116 of the second through hole 105.

In other embodiments, the first conductive layer further includes an electric contact layer, located between the diffusion barrier layer and the first through hole or between the diffusion barrier layer and the second through hole, and at least part of the electric contact layer is in contact with the side wall of the first through hole and a side wall of the second through hole.

In some embodiments of the present disclosure, the diffusion barrier layer 116 is further located on the side wall, away from the top of the dielectric layer 102, of the first through hole and all the side wall of the second through hole, in other words, the diffusion barrier layer 116 further covers part of the side wall of the first through hole. The diffusion barrier layer 116 located on the side wall of the first through hole has a height of less than or equal to 50 nm and a thickness of 5-15 nm.

In other embodiments, the diffusion barrier layer may also expose the whole side wall of the first through hole.

In some embodiments of the present disclosure, the diffusion barrier layer 116 located on the side wall of the first through hole has the height of less than or equal to 50 nm and the thickness of 5-15 nm. Correspondingly, a size of the gap is small, the conductive connecting wire cannot easily enter the gap, so that the conductive connecting wire is prevented from being electrically connected to the diffusion barrier layer 116 located on the side wall of the first through hole.

In other embodiments, the diffusion barrier layer may be located on the whole side wall and bottom of the second through hole and only located at the bottom of the first through hole. The metal layer may also be located on the diffusion barrier layer in the first through hole, and a gap is formed between the metal layer and the side wall of the first through hole, which is beneficial to avoiding electrical connection of adjacent conductive connecting wires through the metal layer.

In some embodiments of the present disclosure, the substrate 100 is further provided with an array region. The array region is arranged with a second contact hole penetrating through the dielectric layer 102; a third conductive layer is formed in the second contact hole, a top of the third conductive layer is lower than the top of the dielectric layer 102, and the remaining part of the second contact hole is define as a third through hole; the third through hole is arranged with the first conductive layer 106; and a plurality of discrete landing pads located above the first conductive layer 106.

According to the semiconductor structure provided by this embodiment, because the gap is formed between the side wall of the first through hole and the first conductive layer 106, no short circuit occurs between the adjacent conductive connecting wires 117 due to the arrangement of the gap, signal interference between the adjacent conductive connecting wires 117 is avoided, and therefore the electrical performance of the semiconductor structure is improved.

Other embodiments of the disclosure will be apparent to those skilled in the art from consideration of the specification and practice of the disclosure. The present disclosure is intended to cover any variations, uses, or adaptations of the present disclosure following the general principles of the present disclosure and including common general knowledge or customary technical means in the art not disclosed in the present disclosure. The specification and embodiments are considered to be exemplary only, and the true scope and spirit of the present disclosure are indicated by the following claims.

It is to be understood that the present disclosure is not limited to the precise constructions described above and illustrated in the accompanying drawings, and various modifications and changes may be made without departing from the scope thereof. The scope of the present disclosure is limited only by the appended claims.

INDUSTRIAL APPLICABILITY

According to a semiconductor structure and a manufacturing method thereof provided by the present disclosure, in the manufacturing method of the semiconductor structure, after a first conductive layer filling a first through hole and a second through holes is formed, at least part of the first conductive layer located on a side wall of the first through hole is removed; when a second conductive layer is patterned subsequently to form a conductive connecting wire, part of the first through hole is exposed at the interval of adjacent conductive connecting wires; and because the at least part of the first conductive layer on the side wall of the first through hole has been removed, the adjacent conductive connecting wires cannot be electrically connected through the first conductive layer on the side wall of the first through hole, which is beneficial to reducing signal interference between the adjacent conductive connecting wires.

The invention claimed is:

1. A manufacturing method of a semiconductor structure, comprising:
    providing a substrate; wherein the substrate comprises a peripheral region, the peripheral region comprises a wire lead-out area, the substrate is arranged with a plurality of discrete bit line structures, a dielectric layer is formed between the adjacent bit line structures, and the peripheral region is arranged with a first contact hole penetrating through the dielectric layer;
    forming a filling layer; wherein the filling layer fills part of the first contact hole, a top of the filling layer is lower than a top of the dielectric layer, and a remaining part of the first contact hole is defined as a first through hole;
    etching the wire lead-out area, and forming second through holes; wherein a number of the second through holes is at least two;
    forming a first conductive layer; wherein the first conductive layer fills the first through hole and the second through holes; removing at least part of the first conductive layer located on a side wall of the first through hole;

forming a second conductive layer; wherein the second conductive layer is a continuous film layer, and the second conductive layer is located over the dielectric layer and is also located on a surface of a remaining first conductive layer; and patterning the second conductive layer to form a conductive connecting wire; wherein the conductive connecting wire is electrically connected to the first conductive layer in the wire lead-out area.

2. The manufacturing method of the semiconductor structure according to claim 1, wherein each of the bit line structures comprises a bit line conductive layer and a covering layer, the bit line conductive layer and the covering layer are stacked and formed in sequence, and the step of etching the wire lead-out area comprises: etching the covering layer in the wire lead-out area to expose the bit line conductive layer in the wire lead-out area, and forming the second through holes, a number of the second through holes is at least two.

3. The manufacturing method of the semiconductor structure according to claim 1, wherein the substrate is arranged with a plurality of discrete word lines, and the step of etching the wire lead-out area comprises: etching the wire lead-out area until the word lines are exposed, and forming the second through holes, wherein a number of the second through holes is at least two.

4. The manufacturing method of the semiconductor structure according to claim 1, wherein the step of forming the first conductive layer comprises: sequentially forming a diffusion barrier layer and a metal layer, in the first through hole and the second through hole; the diffusion barrier layer and the metal layer are stacked; the diffusion barrier layer is at least located on the side wall of the first through hole, and the metal layer fills the first through hole and the second through hole; and the step of removing at least part of the first conductive layer located on the side wall of the first through hole comprises: removing at least part of the diffusion barrier layer located on the side wall of the first through hole.

5. The manufacturing method of the semiconductor structure according to claim 4, wherein a thickness of the diffusion barrier layer is 5-15 mm, and the thickness of the diffusion barrier layer is less than a thickness of the metal layer.

6. The manufacturing method of the semiconductor structure according to claim 1, wherein the step of forming the first conductive layer comprises: forming a conductive film filling the first through hole and the second through hole, wherein the conductive film is further located over the dielectric layer; and flattening the conductive film, and removing the conductive film higher than the top of the dielectric layer to form the first conductive layer.

7. The manufacturing method of the semiconductor structure according to claim 1, wherein a length of the first conductive layer removed is greater than or equal to 50 nm in a direction perpendicular to a surface of the substrate.

8. The manufacturing method of the semiconductor structure according to claim 1, wherein a material of the filling layer is an insulating material; and the first contact hole is a pseudo capacitor contact hole.

9. The manufacturing method of the semiconductor structure according to claim 1, wherein the substrate further comprises an array region, and the array region is arranged with a second contact hole penetrating through the dielectric layer;

the manufacturing method of the semiconductor structure further comprises: forming a third conductive layer; wherein the third conductive layer fills part of the second contact hole, a top of the third conductive layer is lower than the top of the dielectric layer, and a remaining part of the second contact hole is defined as a third through hole;

in the step of forming the first conductive layer, the first conductive layer further fills the third through hole;

in the step of forming the second conductive layer, the second conductive layer is further located in the array region; and in the step of patterning the second conductive layer, the second conductive layer located in the array region is further patterned to form a plurality of discrete landing pads, and each of the landing pads is electrically connected to the first conductive layer located in the third through hole.

10. A semiconductor structure, comprising:

a substrate, comprising a peripheral region; wherein the peripheral region comprises a wire lead-out area, and the substrate is arranged with a plurality of discrete bit line structures;

a dielectric layer, formed between the adjacent bit line structures; wherein the peripheral region is arranged with a first contact hole penetrating through the dielectric layer;

a wire lead-out area with a second through hole;

a filling layer, filling part of a first contact hole; wherein a top of the filling layer is lower than a top of the dielectric layer, and a remaining part of the first contact hole is defined as a first through hole;

a first conductive layer, located in the first through hole and the second through hole; wherein a gap is formed between the first conductive layer and a side wall of the first through hole; and a conductive connecting wire, located over the dielectric layer and being in contact with the first conductive layer in the wire lead-out area; wherein the conductive connecting wire is electrically insulated from the first conductive layer located in the first through hole.

11. The semiconductor structure according to claim 10, wherein each of the bit line structures comprises a bit line conductive layer located on the substrate, and a covering layer; the covering layer is located on one side of the bit line conductive layer away from the substrate, and the second through hole exposes the bit line conductive layer.

12. The semiconductor structure according to claim 10, wherein the substrate comprises a plurality of discrete word lines; and the second through hole exposes the word lines.

13. The semiconductor structure according to claim 10, wherein the first conductive layer comprises: a diffusion barrier layer, at least located at a bottom of the first through hole and a bottom of the second through hole; and a metal layer, at least located on the diffusion barrier layer in the second through hole.

14. The semiconductor structure according to claim 13, wherein the metal layer is further located on the diffusion barrier layer in the first through hole, and a gap is formed between the metal layer and the side wall of the first through hole.

* * * * *